US009755009B2

(12) United States Patent
You et al.

(10) Patent No.: US 9,755,009 B2
(45) Date of Patent: Sep. 5, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-Do (KR)

(72) Inventors: Chungi You, Yongin (KR); Gwanggeun Lee, Yongin (KR)

(73) Assignee: Samsung Display Co., Ltd., Samsung-ro, Giheung-Gu, Yongin-si, Gyeonggi-Do (KR)

(*) Notice: Subject to any disclaimer, the term of this patent is extended or adjusted under 35 U.S.C. 154(b) by 0 days.

(21) Appl. No.: 14/871,614

(22) Filed: Sep. 30, 2015

(65) Prior Publication Data

US 2016/0300902 A1    Oct. 13, 2016

(30) Foreign Application Priority Data

Apr. 7, 2015    (KR) .................. 10-2015-0049077

(51) Int. Cl.
*H01L 27/32*    (2006.01)
*H01L 51/52*    (2006.01)

(52) U.S. Cl.
CPC ........ *H01L 27/3272* (2013.01); *H01L 27/326* (2013.01); *H01L 27/3248* (2013.01); *H01L 27/3258* (2013.01); *H01L 27/3276* (2013.01); *H01L 51/5284* (2013.01); *H01L 2227/323* (2013.01); *H01L 2251/5315* (2013.01)

(58) Field of Classification Search
CPC ............ H01L 27/3258; H01L 27/3248; H01L 27/3272; H01L 27/3246; H01L 27/3276; H01L 27/326; H01L 51/5248; H01L 2227/323
See application file for complete search history.

(56) References Cited

U.S. PATENT DOCUMENTS

| | | | |
|---|---|---|---|
| 6,815,887 B2 * | 11/2004 | Lee | ...................... H01L 51/5221 313/504 |
| 8,102,489 B2 | 1/2012 | Kim | |
| 8,357,938 B2 | 1/2013 | Yoon et al. | |
| 8,507,911 B2 | 8/2013 | Kim et al. | |
| 9,136,315 B1 * | 9/2015 | Kim | ................... H01L 27/3276 |
| 2002/0121640 A1 | 9/2002 | Yamazaki | |

(Continued)

FOREIGN PATENT DOCUMENTS

| | | |
|---|---|---|
| JP | 2001-125510 A | 5/2001 |
| KR | 10-2011-0052948 A | 5/2011 |
| KR | 10-2012-0019026 A | 1/2013 |

*Primary Examiner* — Michael Trinh
(74) *Attorney, Agent, or Firm* — Robert E. Bushnell, Esq.

(57) ABSTRACT

An organic light-emitting display apparatus includes a substrate; a plurality of pixels disposed on the substrate, each of the plurality of pixels including a first region through which light is emitted and a second region through which external light is transmitted; a pixel circuit unit disposed in the first region of each of the plurality of pixels and including at least one thin-film transistor (TFT); a black matrix covering the pixel circuit unit and including a first opening corresponding to the second region; a via-insulating film disposed on the black matrix and including a second opening corresponding to the second region; and a light-emitting device disposed in the first region on the via-insulating film.

21 Claims, 16 Drawing Sheets

(56) References Cited

U.S. PATENT DOCUMENTS

| | | | |
|---|---|---|---|
| 2011/0108847 A1 | 5/2011 | Park | |
| 2011/0273650 A1* | 11/2011 | Chae | G02F 1/134363 |
| | | | 349/108 |
| 2012/0267611 A1* | 10/2012 | Chung | H01L 27/3211 |
| | | | 257/40 |
| 2013/0240864 A1* | 9/2013 | Ha | H01L 27/322 |
| | | | 257/40 |
| 2015/0194634 A1* | 7/2015 | Kang | H01L 51/5268 |
| | | | 257/40 |

* cited by examiner

ORGANIC LIGHT-EMITTING DISPLAY APPARATUS AND METHOD OF MANUFACTURING THE SAME

CLAIM OF PRIORITY

This application claims the priority of and all the benefits accruing under 35 U.S.C. §119 of Korean Patent Application No. 10-2015-0049077, filed on Apr. 7, 2015, in the Korean Intellectual Property Office (KIPO), the disclosure of which is incorporated herein in its entirety by reference.

BACKGROUND OF THE INVENTION

1. Field of Disclosure

One or more exemplary embodiments relate to an organic light-emitting display apparatus and a method of manufacturing the same, and more particularly, to a see-through organic light-emitting display apparatus that may recognize not only an image formed by an organic light-emitting display apparatus but also an external background and a method of manufacturing the see-through organic light-emitting display apparatus.

2. Description of the Related Art

An organic light-emitting display apparatus is a self-emissive display apparatus that includes an organic light-emitting device that includes a hole injection electrode, an electron injection electrode, and an organic emission layer between the hole injection electrode and the electron injection electrode. The organic light-emitting device generates light when holes injected from the hole injection electrode and electrons injected from the electron injection electrode combine with each other in the organic emission layer and thus excitons transition from an excited state to a ground state.

Since the organic light-emitting display apparatus that is a self-emissive display apparatus does not need a light source, the organic light-emitting display apparatus may be driven at a low voltage and may be made compact and light. Since the organic light-emitting display apparatus has excellent characteristics such as a wide viewing angle, a high contrast ratio, and a fast response time, the organic light-emitting display apparatus is widely applied to televisions (TVs) as well as personal portable devices such as MP3 players and mobile phones.

Research into a see-through organic light-emitting display apparatus through which a user may recognize not only an image formed by an organic light-emitting display apparatus but also an external background has been carried out.

SUMMARY OF THE INVENTION

One or more exemplary embodiments include an organic light-emitting display apparatus and a method of manufacturing the same.

Additional aspects will be set forth in part in the description which follows and, in part, will be apparent from the description, or may be learned by practice of the presented embodiments.

An organic light-emitting display apparatus is a self-emissive display apparatus that includes an organic light-emitting device that includes a hole injection electrode, an electron injection electrode, and an organic emission layer between the hole injection electrode and the electron injection electrode. The organic light-emitting device generates light when holes injected from the hole injection electrode and electrons injected from the electron injection electrode combine with each other in the organic emission layer and thus excitons transition from an excited state to a ground state.

Since the organic light-emitting display apparatus that is a self-emissive display apparatus does not need a light source, the organic light-emitting display apparatus may be driven at a low voltage and may be made compact and light. Since the organic light-emitting display apparatus has excellent characteristics such as a wide viewing angle, a high contrast ratio, and a fast response time, the organic light-emitting display apparatus is widely applied to televisions (TVs) as well as personal portable devices such as MP3 players and mobile phones.

Research into a see-through organic light-emitting display apparatus through which a user may recognize not only an image formed by an organic light-emitting display apparatus but also an external background has been carried out.

According to one or more exemplary embodiments, an organic light-emitting display apparatus includes: a substrate; a plurality of pixels disposed on the substrate, each of the plurality of pixels including a first region through which light is emitted and a second region through which external light is transmitted; a pixel circuit unit disposed in the first region of each of the plurality of pixels and including at least one thin-film transistor (TFT); a black matrix covering the pixel circuit unit and including a first opening corresponding to the second region; a via-insulating film disposed on the black matrix and including a second opening corresponding to the second region; and a light-emitting device disposed in the first region on the via-insulating film.

A first etched surface of the first opening and a second etched surface of the second opening may be connected to each other without a stepped portion.

Each of the at least one TFT may include: an active layer disposed on the substrate; a gate electrode disposed on the active layer and insulated from the active layer; a first gate insulating film disposed between the active layer and the gate electrode; an interlayer insulating film disposed on the gate electrode; and a source electrode and a drain electrode disposed on the interlayer insulating film and electrically connected to the active layer, respectively, wherein the black matrix and the via-insulating film cover the source electrode and the drain electrode.

The first gate insulating film and the interlayer insulating film may be disposed in the first region and the second region, and may be single films having substantially the same refractive index.

A top surface of the interlayer insulating film may be exposed through the first opening formed in the black matrix and the second opening formed in the via-insulating film.

The organic light-emitting display apparatus may further include a second gate insulating film disposed between the first gate insulating film and the interlayer insulating film, wherein the second gate insulating film is a single film having substantially the same refractive index as the first gate insulating film and the interlayer insulating film.

The organic light-emitting display apparatus may further include a capacitor including a first electrode disposed on the first gate insulating film, a second electrode disposed on the second gate insulating film, and a third electrode disposed on the interlayer insulating film.

The light-emitting device may include: a pixel electrode disposed in the first region of each of the plurality of pixels and electrically connected to the pixel circuit unit; a pixel-defining film covering at least a part of the pixel electrode; a counter electrode facing the pixel electrode, electrically connected to the plurality of pixels, and disposed in at least the first region of each of the plurality of pixels; and an intermediate layer disposed between the pixel electrode and the counter electrode and including an organic emission layer, wherein the pixel-defining film includes a third opening that corresponds to the second region.

The counter electrode may include a fourth opening that corresponds to the second region.

The third opening may have an area that is greater than areas of the first opening and the second opening, and a part of a top surface of the via-insulating film may be exposed between the first opening and the third opening.

The third opening may have an area that is less than areas of the first opening and the second opening, and may include a portion that extends along inner surfaces of the first opening and the second opening.

According to one or more exemplary embodiments, a method of manufacturing an organic light-emitting display apparatus includes: forming a pixel circuit unit including at least one thin-film transistor (TFT) on a substrate including a first region through which light is emitted and a second region through which external light is transmitted; forming a black matrix on the pixel circuit unit; forming a via-insulating film on the black matrix; respectively forming a first opening and a second opening that correspond to the second region in the black matrix and the via-insulating film by simultaneously patterning the black matrix and the via-insulating film; and forming a light-emitting device in the first region on the via-insulating film.

The forming of the first opening and the second opening may include: irradiating light to a portion of the via-insulating film that corresponds to the second region; and forming the first opening and the second opening by removing the portion of the via-insulating film to which the light is irradiated and a portion of the black matrix that is disposed under the portion of the via-insulating film to which the light is irradiated.

The forming of the pixel circuit unit may include: forming an active layer in the first region on the substrate; forming a first gate insulating film to cover the active layer; forming a gate electrode on the first gate insulating film; forming an interlayer insulating film to cover the gate electrode; and forming a source electrode and a drain electrode on the interlayer insulating film, wherein the first gate insulating film and the interlayer insulating film extend from the first region to the second region.

The first gate insulating film and the interlayer insulating film may be formed as single films having substantially the same refractive index.

After the forming of the gate electrode, the method may further include forming a second gate insulating film to cover the gate electrode, wherein the second gate insulating film is formed as a single film having substantially the same refractive index as the first gate insulating film and the interlayer insulating film.

The forming of the light-emitting device may include: forming, in the first region on the via-insulating film, a pixel electrode that is electrically connected to the pixel circuit unit; forming a pixel-defining film on the pixel electrode; forming a third opening that corresponds to the second region and a fifth opening through which a part of the pixel electrode is exposed by patterning the pixel-defining film; forming an intermediate layer including an organic emission layer on the pixel electrode that is exposed through the fifth opening; and forming a counter electrode on the intermediate layer.

After the forming of the counter electrode, the method may further include forming a fourth opening that corresponds to the second region by patterning the counter electrode.

The third opening may have an area that is greater than areas of the first opening and the second opening, and may be formed so that a part of a top surface of the via-insulating film is exposed between the second opening and the third opening.

The third opening may have an area that is less than areas of the first opening and the second opening, and may be formed to include a portion that extends along inner surfaces of the first opening and the second opening.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
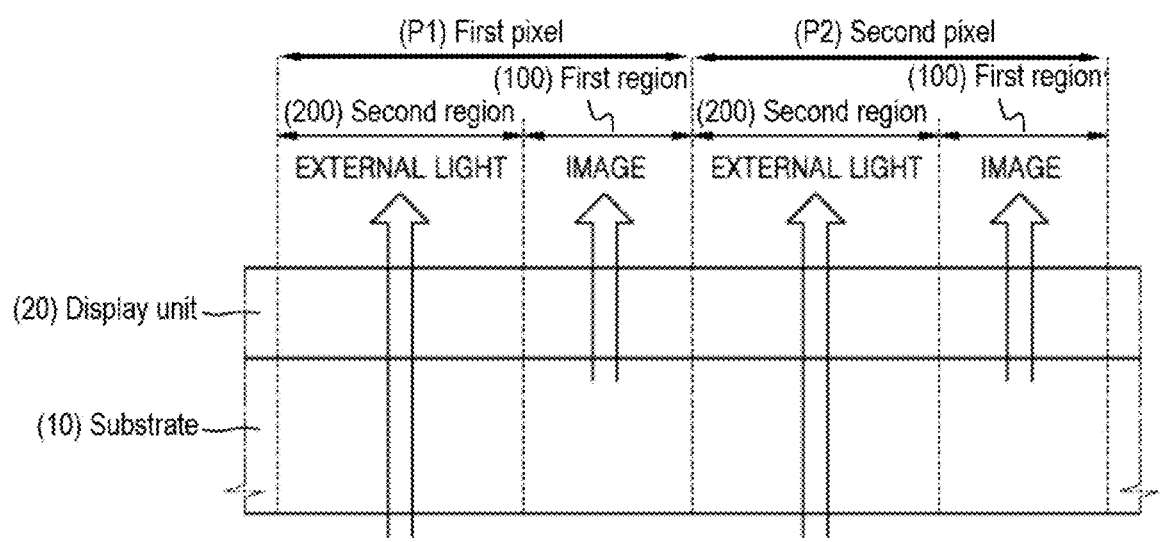
FIG. 1 is a cross-sectional view illustrating an organic light-emitting display apparatus according to an exemplary embodiment.

The inventive concept may include various embodiments and modifications, and exemplary embodiments thereof will be illustrated in the drawings and will be described herein in detail. The effects and features of the inventive concept and the accompanying methods thereof will become apparent from the following description of the embodiments, taken in conjunction with the accompanying drawings. However, the inventive concept is not limited to the embodiments described below, and may be embodied in various modes.

Reference will now be made in detail to embodiments, examples of which are illustrated in the accompanying drawings. In the drawings, the same elements are denoted by the same reference numerals, and a repeated explanation thereof will not be given.

It will be understood that although the terms "first", "second", etc. may be used herein to describe various elements, these elements should not be limited by these terms. These elements are only used to distinguish one element from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "formed on", another layer, region, or element, it can be directly or indirectly formed on the other layer, region, or element. That is, for example, intervening layers, regions, or elements may be present.

Throughout the specification, it will be understood that when a layer, region, or element is referred to as being "connected" to another layer, region or element, it may be "directly connected" to the other layer, region, or element or "may be indirectly connected" to the other layer, region, or element with intervening layers, regions, and elements therebetween. For example, when a layer, region, or element is referred to as being "electrically connected", it may be "directly electrically connected" or "may be indirectly electrically connected" with intervening layers, regions, and elements therebetween.

Sizes of elements may be exaggerated for convenience of explanation. In other words, since sizes and thicknesses of elements in the drawings are arbitrarily illustrated for convenience of explanation, the following exemplary embodiments are not limited thereto.

As used herein, the term "and/or" includes any and all combinations of one or more of the associated listed items. Expressions such as "at least one of" when preceding a list of elements, modify the entire list of elements and do not modify the individual elements of the list.

The inventive concept will now be described more fully with reference to the accompanying drawings, in which exemplary embodiments of the inventive concept are shown.

An organic light-emitting display apparatus is a self-emissive display apparatus that includes an organic light-emitting device that includes a hole injection electrode, an electron injection electrode, and an organic emission layer between the hole injection electrode and the electron injection electrode. The organic light-emitting device generates light when holes injected from the hole injection electrode and electrons injected from the electron injection electrode combine with each other in the organic emission layer and thus excitons transition from an excited state to a ground state.

Since the organic light-emitting display apparatus that is a self-emissive display apparatus does not need a light source, the organic light-emitting display apparatus may be driven at a low voltage and may be made compact and light. Since the organic light-emitting display apparatus has excellent characteristics such as a wide viewing angle, a high contrast ratio, and a fast response time, the organic light-emitting display apparatus is widely applied to televisions (TVs) as well as personal portable devices such as MP3 players and mobile phones.

Research into a see-through organic light-emitting display apparatus through which a user may recognize not only an image formed by an organic light-emitting display apparatus but also an external background has been carried out.

FIG. 1 is a cross-sectional view illustrating an organic light-emitting display apparatus according to an exemplary embodiment.

Referring to FIG. 1, the organic light-emitting display apparatus according to an exemplary embodiment includes a substrate 10, and a display unit 20 that is disposed on the substrate 10 and includes a plurality of pixels (e.g., first and second pixels P1 and P2) that each include a first region 100 through which light is emitted and a second region 200 through which external light is transmitted.

The display unit 20 is configured so that external light is transmitted through the display unit 20, and a user who is located at a side where an image is formed may observe an external image outside the substrate 10. In FIG. 1, the display unit 20 may be a top-emission display unit in which an image of the display unit 20 is formed from the display unit 20 opposite to the substrate 10.

In FIG. 1, the first pixel P1 and the second pixel P2 that are two adjacent pixels of the organic light-emitting display apparatus are illustrated. Each of the first and second pixels P1 and P2 includes the first region 100 and the second region 200, and an image is formed from the display unit 20 through the first region 100 and external light is transmitted through the second region 200.

That is, since each of the first and second pixels P1 and P2 includes the first region 100 through which an image is formed and the second region 200 through which external light is transmitted, the user may observe the image formed from the display unit 20 and/or an external image through the organic light-emitting display apparatus.

Since a thin-film transistor (TFT), a capacitor, and an organic light-emitting device (OLED) are not disposed in the second region 200, an external light transmittance through the second region 200 may be increased and an external light transmittance of the organic light-emitting display apparatus may be increased. Also, distortion that occurs when a transmitted image is interfered with a TFT, a capacitor, and an organic light-emitting device may be avoided.

Figure 2:
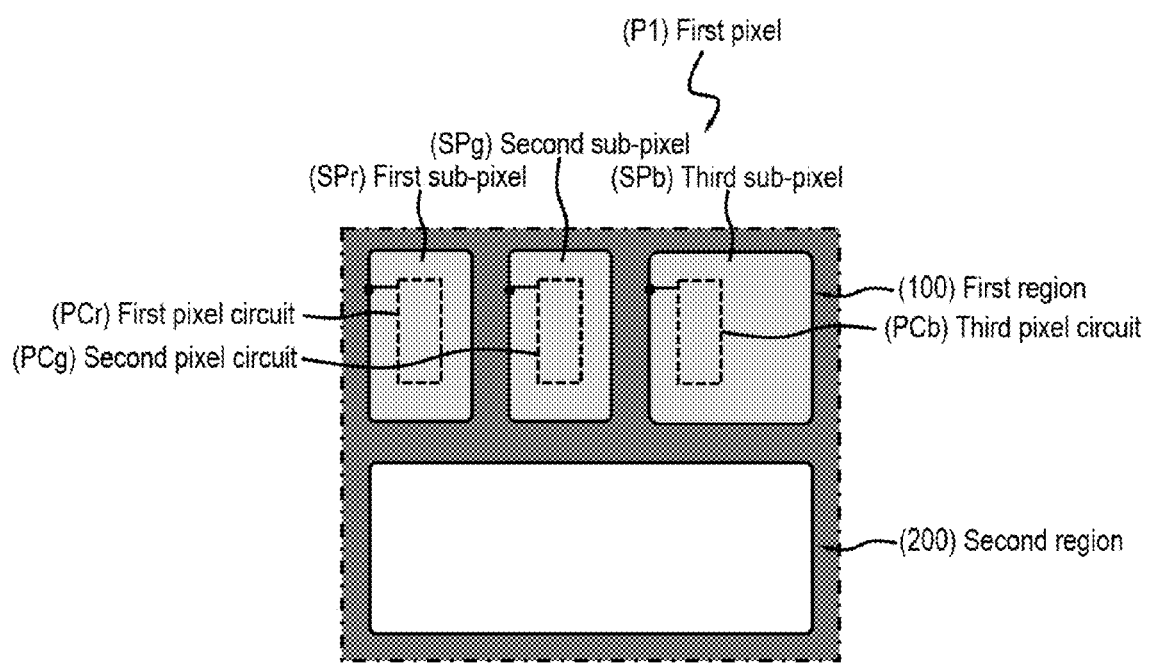
FIG. 2 is a plan view illustrating one pixel that is included in the organic light-emitting display apparatus of FIG. 1.

FIG. 2 is a plan view illustrating one pixel that is included in the organic light-emitting display apparatus of FIG. 1.

Referring to FIG. 2, one pixel, e.g., the first pixel P1, that is included in the display unit 20 (see FIG. 1) includes the first region 100 through which light is emitted and the second region 200 through which external light is transmitted, and the user may observe an external image through the second region 200. That is, the organic light-emitting display apparatus may be a transparent display apparatus.

A first sub-pixel SPr, a second sub-pixel SPg, and a third sub-pixel SPb that emit light having different colors may be disposed in the first region 100, and the first sub-pixel SPr, the second sub-pixel SPg, and the third sub-pixel SPb may respectively emit red light, green light, and blue light. However, the present exemplary embodiment is not limited thereto, and as long as white light may be formed, any combination of color light may be made.

The first sub-pixel SPr, the second sub-pixel SPg, and the third sub-pixel SPb may be respectively driven by a first pixel circuit unit PCr, a second pixel circuit unit PCg, and a third pixel circuit unit PCb.

The first pixel circuit unit PCr, the second pixel circuit unit PCg, and the third pixel circuit unit PCb may be disposed to overlap with a pixel electrode 23 (see FIG. 3) that is included in the first sub-pixel SPr, the second sub-pixel SPg, and the third sub-pixel SPb in plan view.

The organic light-emitting display apparatus according to an exemplary embodiment may be a top-emission display apparatus. Since the first through third pixel circuit units PCr, PCg, and PCb are disposed between the substrate 10 (see FIG. 3) and the pixel electrode 23 (see FIG. 3) and thus a separate space for disposing the first through third pixel circuits PCr, PCg, and PCb is not necessary, an aperture ratio may be increased. However, the inventive concept is not limited thereto, and according to other exemplary embodiments, the first through third pixel circuit units PCr, PCg, and PCb may partially overlap with the pixel electrode 23 (see FIG. 3) or may not overlap with the pixel electrode 23 in plan view.

Since a device including an opaque material such as a reflective electrode or a wiring is not disposed in the second region 200 and only a transparent insulating film may be disposed in the second area 200, an external image itself outside the organic light-emitting display apparatus may be transmitted through the second region 200.

Figure 3:
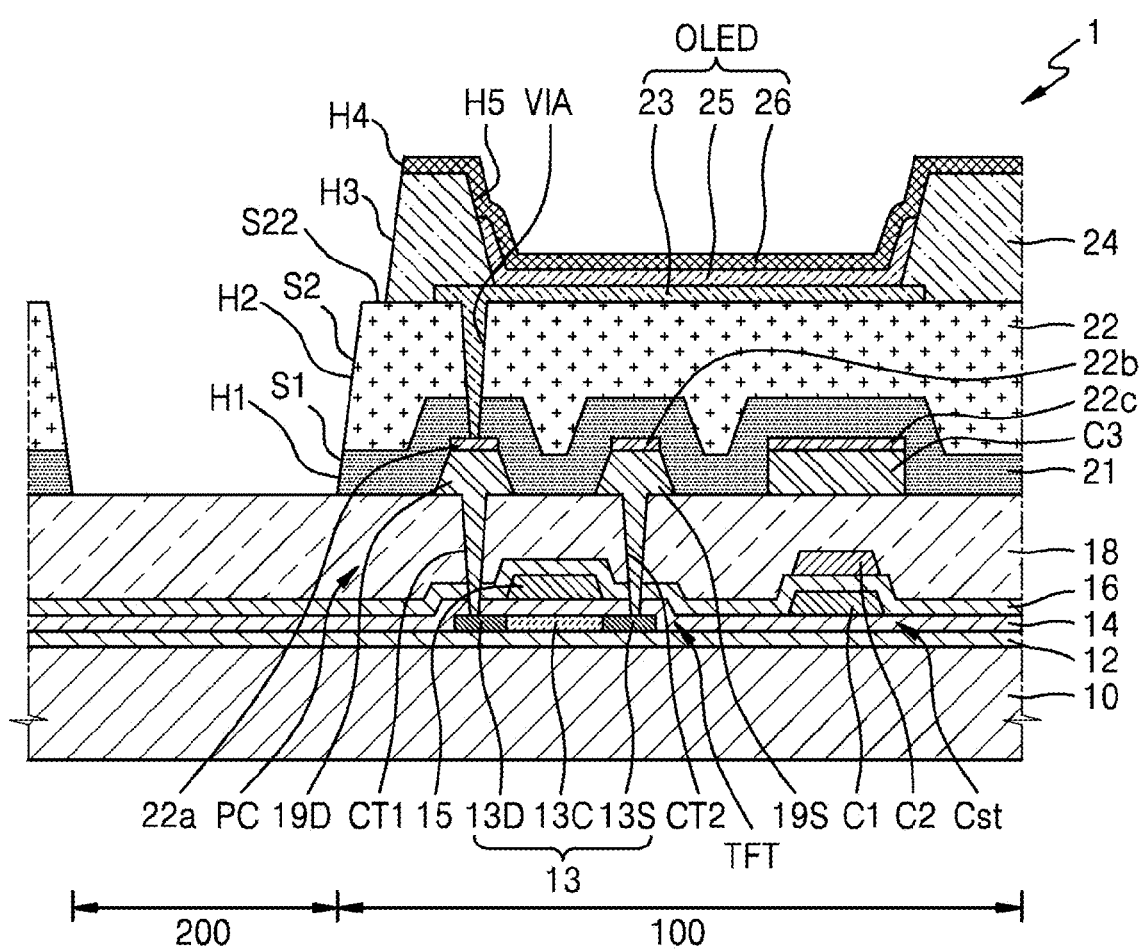
FIG. 3 is a cross-sectional view illustrating one pixel that is included in an organic light-emitting display apparatus, according to an exemplary embodiment.

FIG. 3 is a cross-sectional view illustrating one pixel that is included in an organic light-emitting display apparatus 1, according to an exemplary embodiment.

Referring to FIG. 3, the organic light-emitting display apparatus 1 according to an exemplary embodiment includes the substrate 10, a plurality of pixels (e.g., the first and second pixels P1 and P2 of FIG. 1) that are disposed on the substrate 10 and each include the first region 100 through which light is emitted and the second region 200 through which external light is transmitted, a pixel circuit unit PC that is disposed in the first region 100 of each of the first and second pixels P1 and P2 and includes at least one TFT, a black matrix 21 that covers the pixel circuit unit PC and includes a first opening H1 corresponding to the second region 200, a via-insulating film 22 that is disposed on the black matrix 21 and includes a second opening H2 corresponding to the second region 200, and an OLED that is disposed in the first region 100 on the via-insulating film 22.

The substrate 10 may be formed of glass or plastic, and a buffer layer 12 may be disposed on the substrate 10. The buffer layer 12 may function to prevent impurity elements from penetrating through the substrate 10 and to planarize a surface, and may be formed to have a single-layer structure or a multi-layer structure formed of silicon nitride ($SiN_x$) and/or silicon oxide ($SiO_x$).

The TFT may be disposed in the first region 100 on the buffer layer 12, the TFT may include an active layer 13, a gate electrode 15 that is disposed to be insulated from the active layer 13, and a source electrode 19S and a drain electrode 19D that are electrically connected to the active layer 13, a first gate insulating film 14 may be disposed between the active layer 13 and the gate electrode 15, and an interlayer insulating film 18 may be disposed between the gate electrode 15 and the source and drain electrodes 19S and 19D. The active layer 13 may include a channel region 13C, and a source region 13S and a drain region 13D that are disposed on both sides of the channel region 13C.

The source electrode 19S and the drain electrode 19D may be respectively electrically connected to the source region 13S and the drain region 13D through a first contact hole CT1 and a second contact hole CT2 that are formed in the first and second gate insulating films 14 and 16 and the interlayer insulating film 18.

The first gate insulating film 14 and the interlayer insulating film 18 may be disposed in the first region 100 and the second region 200. That is, the first gate insulating film 14 and the interlayer insulating film 18 may also be disposed in the second region 200 through which an external background image is transmitted, and may each be formed of a transparent insulating material.

The black matrix 21 and the via-insulating film 22 may be disposed on the source electrode 19S and the drain electrode 19D, and may respectively include the first opening H1 and the second opening H2 that correspond to the second region 200. That is, the black matrix 21 and the via-insulating film 22 may not be disposed in the second region 200.

Accordingly, a top surface of a portion of the interlayer insulating film 18 that corresponds to the second region 200 may be exposed through the first opening H1 and the second opening H2 that are respectively formed in the black matrix 21 and the via-insulating film 22.

The second gate insulating film 16 may be disposed between the first gate insulating film 14 and the interlayer insulating film 18, and may be disposed in the first region 100 and the second region 200.

Light from an external background image is transmitted through the second region 200 of the organic light-emitting display apparatus 1 and is perceived by the user. Accordingly, since only a transparent insulating film or the like may be disposed in the second region 200, interfacial reflection between films that are disposed in the second region 200 may be minimized and a transmittance through the second region 200 may be increased.

The interfacial reflection may increase as a refractive index difference between the films that contact each other increases. According to an exemplary embodiment, the first gate insulating film 14, the second gate insulating film 16, and the interlayer insulating film 18 may be single films having substantially the same refractive index. Since the first gate insulating film 14, the second gate insulating film 16, and the interlayer insulating film 18 that are disposed in the second region 200 are configured to have the same refractive index, interfacial reflection between films may be minimized and a transmittance of light from an external background image through the second region 200 may be increased.

According to an exemplary embodiment, the first gate insulating film 14, the second gate insulating film 16, and the interlayer insulating film 18 may be single films formed of silicon dioxide ($SiO_2$). Likewise, the buffer layer 12 that is disposed under the first gate insulating film 14 may also be a single film formed of $SiO_2$. A refractive index of $SiO_2$ may be about 1.45. When the substrate 10 is formed of glass, since refractive indices of all elements that are disposed in the second region 200 are substantially the same, interfacial reflection between films may be minimized.

The active layer 13 may include various materials. For example, the active layer 13 may include an inorganic semiconductor material such as amorphous silicon or crystalline silicon. Alternatively, the active layer 13 may include an oxide semiconductor or an organic semiconductor material.

The gate electrode 15 may be formed to have a single-layer structure or a multi-layer structure formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the gate electrode 15 may have a 3-layer structure formed of Mo/A/Mo or Ti/Al/Ti.

The source electrode 19S and the drain electrode 19D may be formed by stacking two or more layers formed of a metal selected from Al, Pt, Pd, Ag, Mg, Au, Ni, Nd, Ir, Cr, Ni, Ca, Mo, Ti, W, Cu, and an alloy thereof.

A capacitor Cst may be further disposed in the first region 100 on the buffer layer 12, and may include a first electrode C1 that is disposed on the first gate insulating film 14, a second electrode C2 that is disposed on the second gate insulating film 16, and a third electrode C3 that is disposed on the interlayer insulating film 18. That is, since the capacitor Cst may be formed to have a multi-capacitor structure, an area of the pixel circuit unit PC in a pixel may be minimized and a high-capacity capacitor may be obtained.

A first pad conductive film 22a, a second pad conductive film 22b, and a third pad conductive film 22c may be respectively disposed on the source electrode 19S, the drain electrode 19D, and the third electrode C3 of the capacitor Cst, and each of the first through third pad conductive films 22a, 22b, and 22c may be formed of a transparent conductive material such as indium tin oxide (ITO).

Although not shown in FIG. 3, a data pad unit (not shown) may include a data electrode (not shown) that is formed on the same layer by using the same material as the source electrode 19S and the drain electrode 19D. In order to prevent the data electrode from being exposed to the outside and being damaged, a protective layer (not shown) may be formed on the data electrode.

The protective layer may be formed of a transparent conductive material such as ITO, and the first through third pad conductive films 22a, 22b, and 22c may be formed of the same material by using the same process as the protective layer.

In this case, since the first through third pad conductive films 22a, 22b, and 22c may be patterned along with the source electrode 19S and the drain electrode 19D by using one mask, the number of masks may be reduced.

The black matrix 21 and the via-insulating film 22 that cover the source electrode 19S and the drain electrode 19D may be disposed on the interlayer insulating film 18, and the pixel electrode 23 that is electrically connected to the drain electrode 19D, a counter electrode 26 that is disposed to face the pixel electrode 23, and an intermediate layer 25 that is disposed between the pixel electrode 23 and the counter electrode 26 and includes an organic emission layer that emits light may be disposed on the via-insulating film 22. Both edges of the pixel electrode 23 may be covered by a pixel-defining film 24.

The pixel electrode 23 may be electrically connected to the drain electrode 19D through a via-hole VIA that is formed in the via-insulating film 22 and the black matrix 21.

According to an exemplary embodiment, the black matrix 21 may include an organic insulating material and a black pigment that is included in the organic insulating material, and may absorb incident light. The via-insulating film 22 may be formed of an organic material such as polyimide (PI) and may cover and planarize devices such as the TFT.

Since the black matrix 21 and the via-insulating film 22 respectively include the first opening H1 and the second opening H2 that correspond to the second region 200 and are simultaneously patterned, a first etched surface S1 of the first opening H1 and a second etched surface S2 of the second opening H2 may be connected to each other without a stepped portion. According to an exemplary embodiment, since the black matrix 21 and the via-insulating film 22 are simultaneously patterned, the number of mask processes may be reduced.

If the black matrix 21 is formed on another member such as a sealing substrate, the black matrix 21 may occupy a space that, otherwise, may be occupied by the second region 200 and thus an area of the second region 200 may be reduced. However, according to an exemplary embodiment, since a reduction in a space occupied by the second region 200 due to the black matrix 21 may be reduced, an area of the second region 200 may be increased. That is, an aperture ratio of a transmission region may be increased and a transmittance of the organic light-emitting display apparatus 1 may be increased.

According to an exemplary embodiment, a ratio of an area of the second region 200 to a total area of one pixel may be about 60% or more.

The pixel-defining film 24 and the counter electrode 26 may respectively include a third opening H3 and a fourth opening H4 that correspond to the second region 200.

The third opening H3 may have an area that is greater than areas of the first opening H1 and the second opening H2, and a part S22 of a top surface of the via-insulating film 22 may be exposed between the second opening H2 and the third opening H3.

Since the black matrix 21, the via-insulating film 22, the pixel-defining film 24, and the counter electrode 26 are not disposed in the second region 200, a transmittance of the second region 200 may be increased. Since an area of the third opening H3 is greater than areas of the first opening H1 and the second opening H2, an aperture ratio of the second region 200 may be increased.

The pixel electrode 23 may be a reflective electrode, and may include a reflective layer including Ag, Mg, Al, Pt, Pd, Au, Ni, Nd, Ir, Cr, and/or a compound thereof and a transparent and or semi-transparent electrode layer that is formed over and/or under the reflective layer. The pixel electrode 23 may be formed as an isolated island in each sub-pixel and may be disposed in the first region 100 of each sub-pixel.

The counter electrode 26 may be a transparent or semi-transparent electrode, and may include at least one material selected from Ag, Al, Mg, Li, Ca, Cu, LiF/Ca, LiF/Al, MgAg, and CaAg. The counter electrode 26 may be formed as a thin film having a thickness ranging from several to tens of nm to transmit therethrough light emitted from the intermediate layer 25 to the outside. The counter electrode 26 may be provided to be electrically connected to all pixels that are included in the organic light-emitting display apparatus 1.

The intermediate layer 25 may be disposed on the pixel electrode 23 that is exposed through a fifth opening H5 that is formed in the pixel-defining film 24. The intermediate layer 25 may include an organic emission layer that emits light, and may further include at least one of a hole injection layer (HIL), a hole transport layer (HTL), an electron transport layer (ETL), and an electron injection layer (EIL). However, the present exemplary embodiment is not limited thereto, and various functional layers may be further disposed between the pixel electrode 23 and the counter electrode 26.

The organic emission layer may emit red light, green light, or blue light. However, the present exemplary embodiment is not limited thereto, and the organic emission layer may emit white light. In this case, the organic emission layer may have a structure in which a light-emitting material that emits red light, a light-emitting material that emits green light, and a light-emitting material that emits blue light are stacked, or may have a structure in which a light-emitting material that emits red light, a light-emitting material that emits green light, and a light-emitting material that emits blue light are mixed with one another.

The red light, green light, and blue light are exemplary, and the present exemplary embodiment is not limited thereto. That is, as long as white light may be emitted, any of other various combinations may be used instead of a combination of the red, green, and blue light.

The organic light-emitting display apparatus 1 according to an exemplary embodiment may be a top-emission display apparatus that forms an image toward the counter electrode 26, and the pixel circuit unit PC including the TFT may be disposed between the substrate 10 and the pixel electrode 23.

Figure 4:
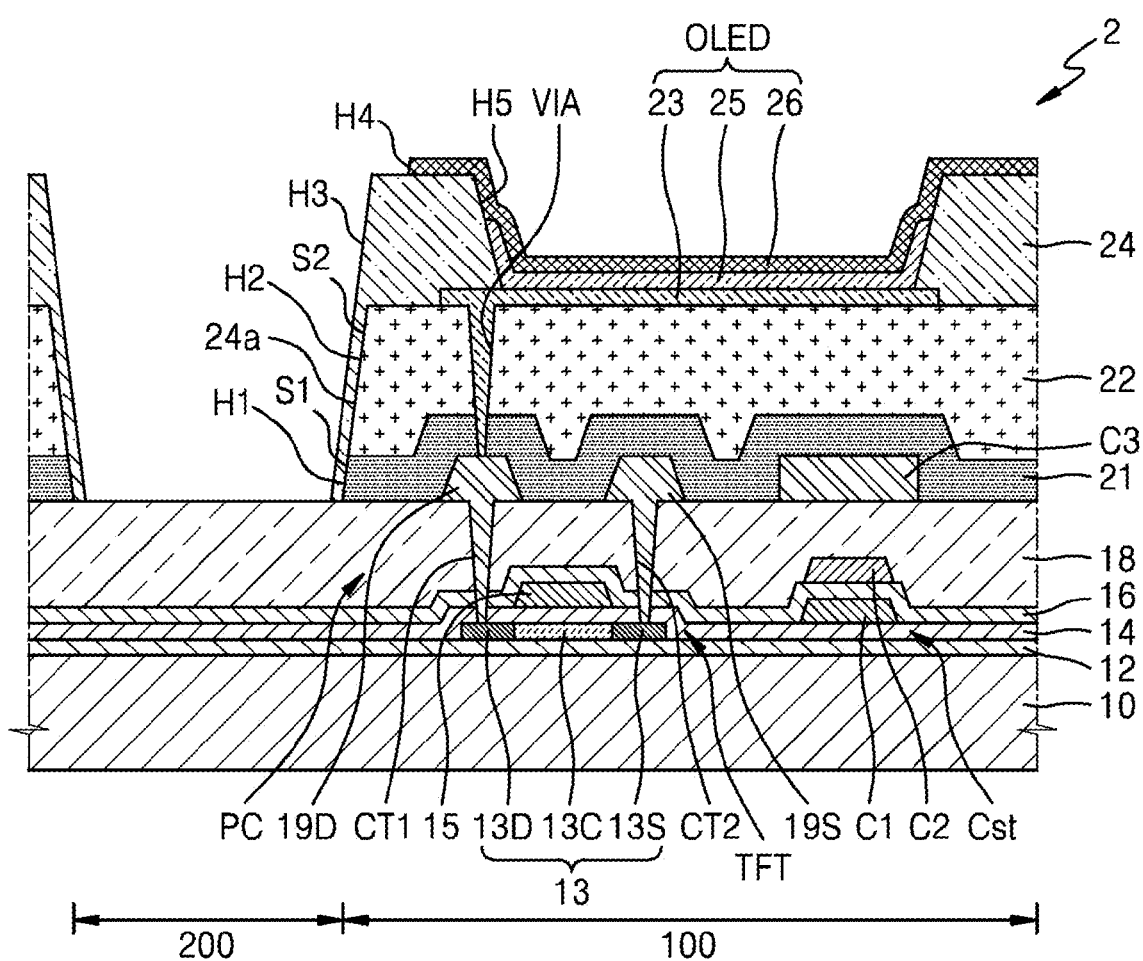
FIGS. 4 and 5 are a cross-sectional view illustrating one pixel that is included in an organic light-emitting display apparatus, according to other exemplary embodiments, respectively.
Figure 5:
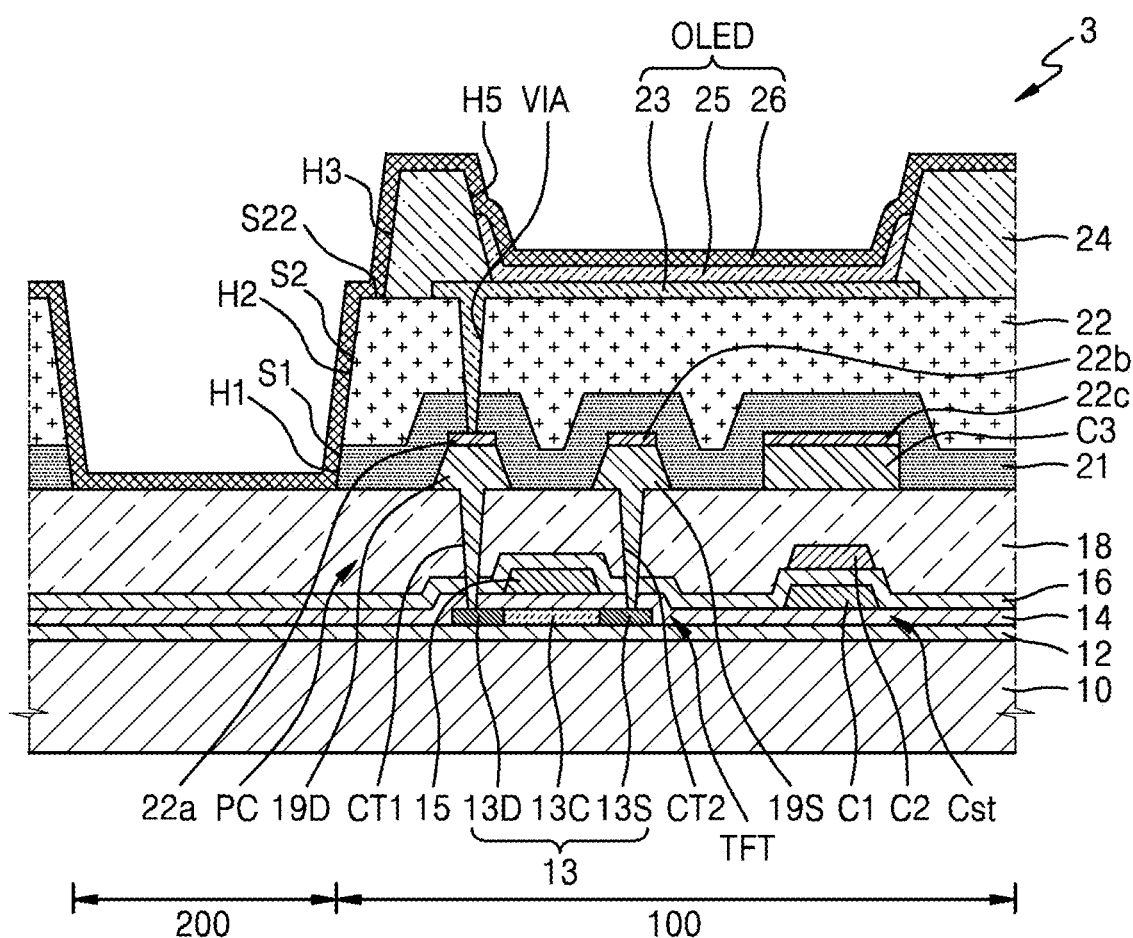

FIGS. 4 and 5 are each a cross-sectional view illustrating one pixel that is included in an organic light-emitting display apparatus, according to other exemplary embodiments.

Referring to FIG. 4, an organic light-emitting display apparatus 2 according to an exemplary embodiment includes the substrate 10, a plurality of pixels, e.g., the first and second pixels P1 and P2 (see FIG. 1), that are disposed on the substrate 10 and each include the first region 100 through which light is emitted and the second region 200 through which external light is transmitted, the pixel circuit unit PC that is disposed in the first region 100 of each of the first and second pixels P1 and P2 and includes at least one TFT, the black matrix 21 that covers the pixel circuit unit PC and includes the first opening H1 corresponding to the second region 200, the via-insulating film 22 that is disposed on the black matrix 21 and includes the second opening H2 corresponding to the second region 200, and the OLED that is disposed in the first region 100 on the via-insulating film 22.

The substrate 10, the buffer layer 12, the first gate insulating film 14, the second gate insulating film 16, and the interlayer insulating film 18 may be sequentially disposed in the second region 200, and the black matrix 21 and the via-insulating film 22 may respectively include the first opening H1 and the second opening H2 that correspond to the second region 200.

According to an exemplary embodiment, the first gate insulating film 14, the second gate insulating film 16, and the interlayer insulating film 18 may be single films having substantially the same refractive index. Since the first gate insulating film 14, the second gate insulating film 16, and the interlayer insulating film 18 that are disposed in the second region 200 are configured to have the same refractive index, interfacial reflection between films may be minimized and a transmittance of light from an external background image through the second region 200 may be increased.

The black matrix 21 and the via-insulating film 22 that cover the source electrode 19S and the drain electrode 19D may be disposed on the interlayer insulating film 18, and the pixel electrode 23 that is electrically connected to the drain electrode 19D, the counter electrode 26 that is disposed to face the pixel electrode 23, and the intermediate layer 25 that is disposed between the pixel electrode 23 and the counter electrode 26 and includes an organic emission layer that emits light may be disposed on the via-insulating film 22. Both edges of the pixel electrode 23 may be covered by the pixel-defining film 24.

Since the black matrix 21 and the via-insulating film 22 respectively include the first opening H1 and the second opening H2 that correspond to the second region 200 and are simultaneously patterned, the first etched surface S1 of the first opening H1 and the second etched surface S2 of the second opening H2 may be connected to each other without a stepped portion. According to an exemplary embodiment, since the black matrix 21 and the via-insulating film 22 are simultaneously patterned, the number of mask processes may be reduced.

According to an exemplary embodiment, the pixel-defining film 24 that is disposed on the via-insulating film 22 may include the third opening H3 that corresponds to the second region 200, the third opening H3 may have an area that is less than areas of the first opening H1 and the second opening H2, and the pixel-defining film 24 may include a portion 24a that extends along inner surfaces of the first opening H1 and the second opening H2.

That is, since the first etched surface S1 and the second etched surface S2 are covered by the pixel-defining film 24 not to be exposed to the outside, outgassing that may be caused by the black matrix 21 may be avoided.

The counter electrode 26 may be disposed on top surfaces of the intermediate layer 25 and the pixel-defining film 24, and the fourth opening H4 that is formed in the counter electrode 26 may have an area that is greater than an area of the third opening H3 that is formed in the pixel-defining film 24. That is, the counter electrode 26 may not extend into the third opening H3 that is formed in the pixel-defining film 24.

The organic light-emitting display apparatus 2 of FIG. 4 may not include the first through third pad conductive films 22a, 22b, and 22c that are included in the organic light-emitting display apparatus 1 of FIG. 1, and other elements of the organic light-emitting display apparatus 2 of FIG. 4 which are not described above may be the same as those of the organic light-emitting display apparatus 1 of FIG. 3.

Referring to FIG. 5, an organic light-emitting display apparatus 3 according to an exemplary embodiment includes the substrate 10, a plurality of pixels (e.g., the first and second pixels P1 and P2 (see FIG. 1)) that each include the first region 100 through which light is emitted and the second region 200 through which external light is transmitted, the pixel circuit unit PC that is disposed in the first region 100 of each of the first and second pixels P1 and P2 and includes at least one TFT, the black matrix 21 that covers the pixel circuit unit PC and includes the first opening H1 corresponding to the second region 200, the via-insulating film 22 that is disposed on the black matrix 21 and includes the second opening H2 corresponding to the second region 200, and the OLED that is disposed in the first region 100 on the via-insulating film 22.

The substrate 10, the buffer layer 12, the first gate insulating film 14, the second gate insulating film 16, and the interlayer insulating film 18 may be sequentially disposed in the second region 200, and the black matrix 21 and the via-insulating film 22 may respectively include the first opening H1 and the second opening H2 that correspond to the second region 200.

According to an exemplary embodiment, the first gate insulating film 14, the second gate insulating film 16, and the interlayer insulating film 18 may be single films having substantially the same refractive index. Since the first gate insulating film 14, the second gate insulating film 16, and the interlayer insulating film 18 that are disposed in the second region 200 are configured to have the same refractive index, interfacial reflection between films may be minimized and a transmittance of light from an external background image through the second region 200 may be increased.

The black matrix 21 and the via-insulating film 22 that cover the source electrode 19S and the drain electrode 19D may be disposed on the interlayer insulating film 18, and the pixel electrode 23 that is electrically connected to the drain electrode 19D, the counter electrode 26 that is disposed to face the pixel electrode 23, and the intermediate layer 25 that is disposed between the pixel electrode 23 and the counter electrode 26 and includes an organic emission layer that emits light may be disposed on the via-insulating film 22. Both edges of the pixel electrode 23 may be covered by the pixel-defining film 24.

Since the black matrix 21 and the via-insulating film 22 respectively include the first opening H1 and the second opening H2 that correspond to the second region 200 and are simultaneously patterned, the first etched surface S1 of the first opening H1 and the second etched surface S2 of the second opening H2 may be connected to each other without a stepped portion. According to an exemplary embodiment, since the black matrix 21 and the via-insulating film 22 are simultaneously patterned, the number of mask processes may be reduced.

According to an exemplary embodiment, the pixel-defining film 24 that is disposed on the via-insulating film 22 may include the third opening H3 that corresponds to the second region 200, the third opening H3 may have an area that is greater than areas of the first opening H1 and the second opening H2, and the part S22 of a top surface of the via-insulating film 22 may be exposed between the second opening H2 and the third opening H3.

According to an exemplary embodiment, the counter electrode 26 may extend from the first region 100 to the second region 200, and may extend along inner surfaces of the first through third openings H1, H2, and H3 to cover a top surface of the interlayer insulating film 18 that is exposed through the first through third openings H1, H2, and H3. In FIG. 5, since the counter electrode 26 that is commonly disposed in all pixels does not need to be patterned, the number of processes may be reduced.

Other elements of the organic light-emitting display apparatus 3 of FIG. 3 of FIG. 5 which are not described above may be the same as those of the organic light-emitting display apparatus 1 of FIG. 3.

FIGS. 6A through 6K are sequential cross-sectional views for explaining a method of manufacturing the organic light-emitting display apparatus 1 of FIG. 3.

Referring to FIGS. 6A through 6E, the method according to an exemplary embodiment may include forming the pixel circuit unit PC including at least one TFT on the substrate 10 including the first region 100 through which light is emitted and the second region 200 through which external light is transmitted.

Figure 6A:
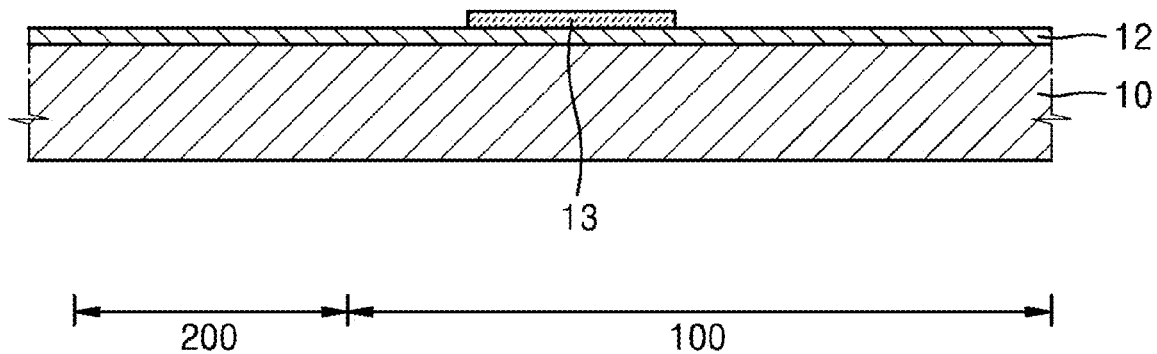
FIGS. 6A through 6K are sequential cross-sectional views for explaining a method of manufacturing the organic light-emitting display apparatus of FIG. 3.

Referring to FIG. 6A, after the buffer layer 12 is formed on an entire surface of the substrate 10, a semiconductor material may be formed and patterned in the first region 100 on the buffer layer 12 to form the active layer 13. The buffer layer 12 may be formed to have a single-layer structure or a multi-layer structure formed of an inorganic material such as $SiN_x$ and/or $SiO_x$, and the active layer 13 may include an inorganic semiconductor material such as amorphous silicon or crystalline silicon. According to an exemplary embodiment, the buffer layer 12 may be a single film formed of $SiO_2$.

Figure 6B:
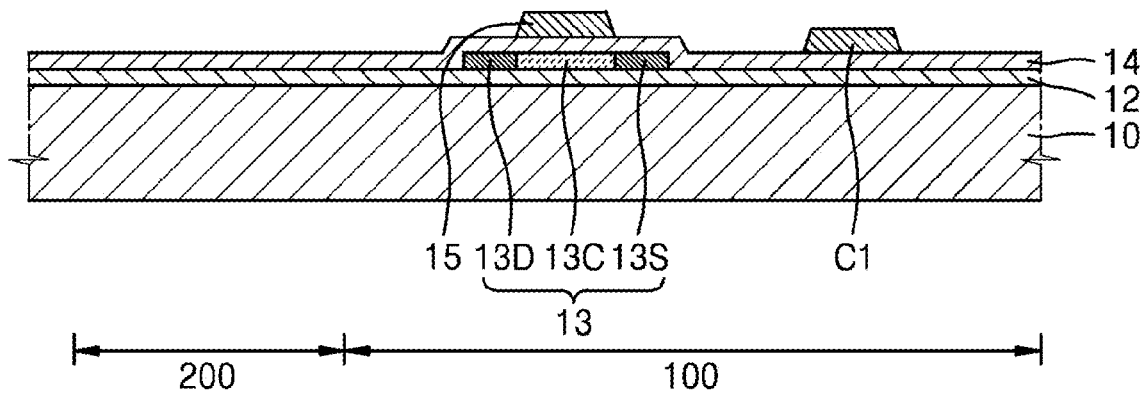

Referring to FIG. 6B, after the first gate insulating film 14 is formed on the buffer layer 12 to cover the active layer 13, the first gate electrode 15 and the first electrode C1 may be formed on the first gate insulating film 14, and the source region 13S and the drain region 13D may be formed by doping both edges of the active layer 13 by using the gate electrode 15 as a mask. A portion of the active layer 13 that is not doped may correspond to the channel region 13C that connects the source region 13S and the drain region 13D.

According to an exemplary embodiment, the first gate insulating film 14 may be formed in the first region 100 and the second region 200, and may be a single film formed of $SiO_2$. The gate electrode 15 and the first electrode C1 may be formed to have a single-layer structure or a multi-layer structure formed of at least one of Al, Pt, Pd, Ag, Mg, Au, Ni, Nd, Ir, Cr, Li, Ca, Mo, Ti, W, and Cu.

Figure 6C:
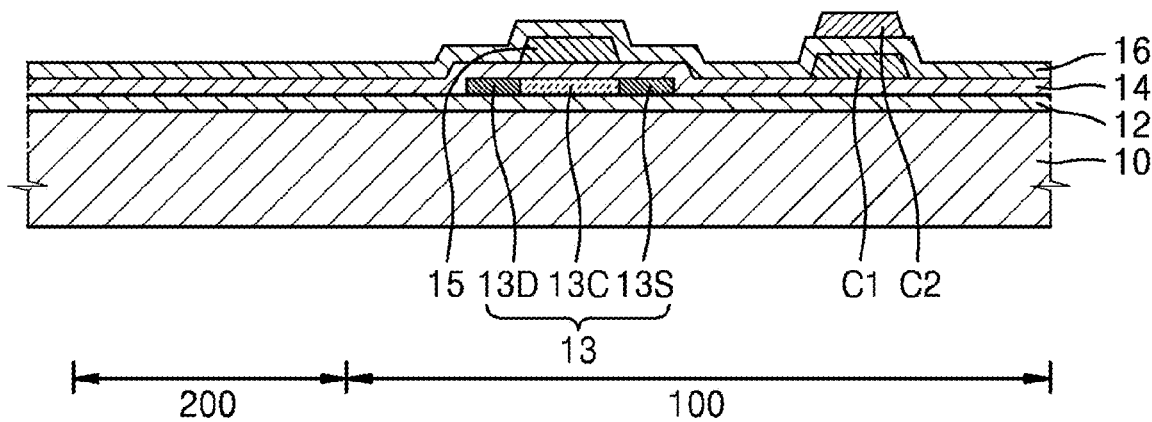

Referring to FIG. 6C, after the second gate insulating film 16 is formed on the first gate insulating film 14 to cover the gate electrode 15 and the first electrode C1, the second electrode C2 may be formed on the second gate insulating film 16 to partially overlap with the first electrode C1 in plan view.

The second gate insulating film 16 may be formed in the first region 100 and the second region 200, and may be a single film formed of $SiO_2$. The second electrode C2 may be formed to have a single-layer structure or a multi-layer structure formed of at least one of Al, Pt, Pd, Ag, Mg, Au, Ni, Nd, Ir, Cr, Li, Ca, Mo, Ti, W, and Cu.

Figure 6D:
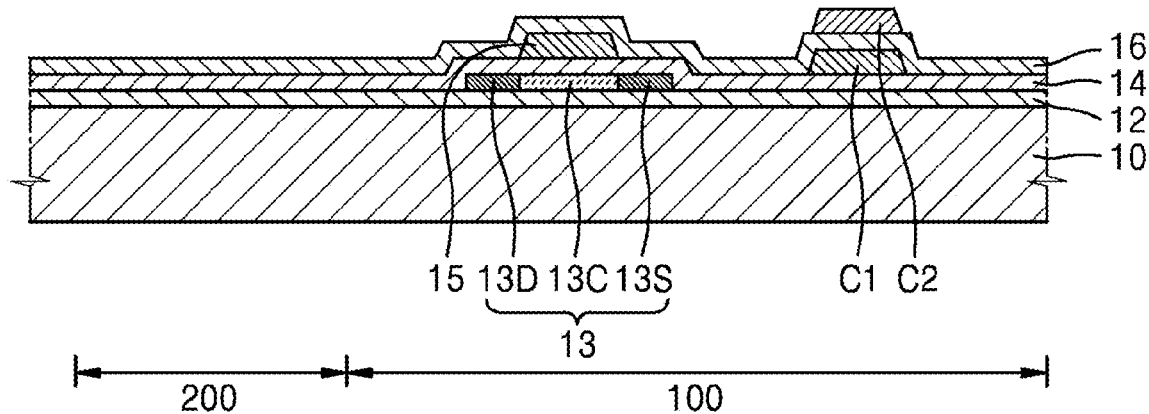

Referring to FIG. 6D, after the interlayer insulating film 18 is formed on the second gate insulating film 16 to cover the second electrode C2, the first and second contact holes CT1 and CT2 through which the source region 13S and the drain region 13D of the active layer 13 are exposed in the interlayer insulating film 18, the second gate insulating film 16, and the first gate insulating film 14.

The second gate insulating film 16 may be formed in the first region 100 and the second region 200, and may be a single film formed of $SiO_2$.

Figure 6E:
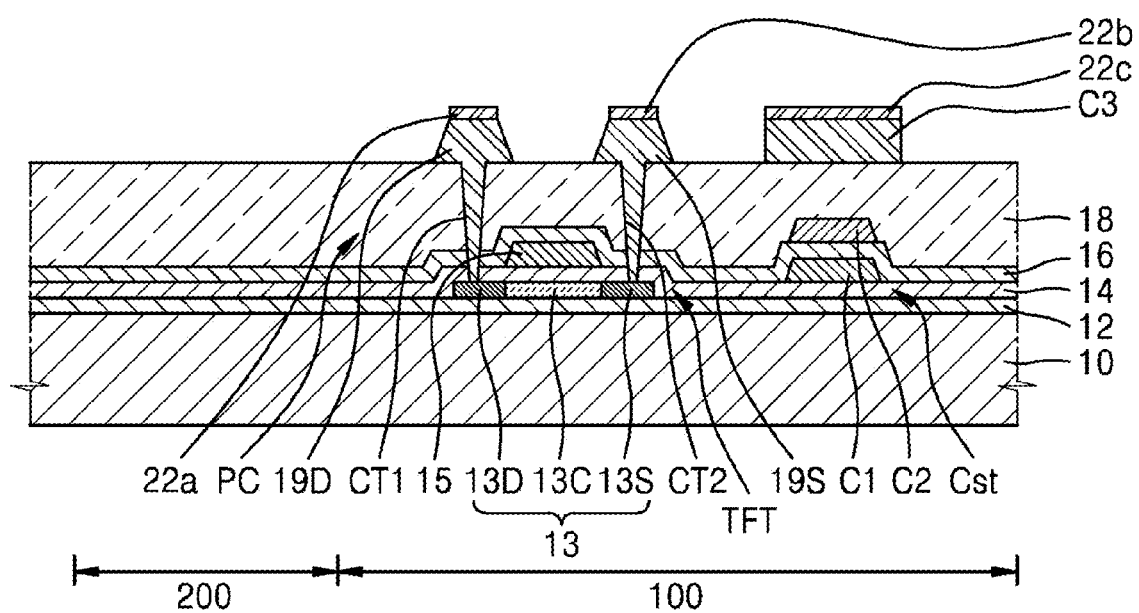

Referring to FIG. 6E, the source electrode 19S, the drain electrode 19D, and the third electrode C3 may be formed on the interlayer insulating film 18. The source electrode 19S and the drain electrode 19D may be respectively electrically connected to the source region 13S and the drain region 13D of the active layer 13.

The source electrode 19S, the drain electrode 19D, and the third electrode C3 may be formed by stacking two or more layers formed of a metal selected from Al, Pt, Pd, Ag, Mg, Au, Ni, Nd, Ir, Cr, Li, Ca, Mo, Ti, W, Cu, and an alloy thereof.

According to an exemplary embodiment, the first pad conductive film 22a, the second pad conductive film 22b, and the third pad conductive pad 22c each formed of a transparent conductive material may be respectively formed on the drain electrode 19D, the source region 19S, and the third electrode C3, and the first through third pad conductive films 22a, 22b, and 22c may be simultaneously patterned with the source electrode 19S, the drain electrode 19D, and the third electrode C3. However, according to another exemplary embodiment, the first through third pad conductive films 22a, 22b, and 22c may be omitted.

Figure 6F:
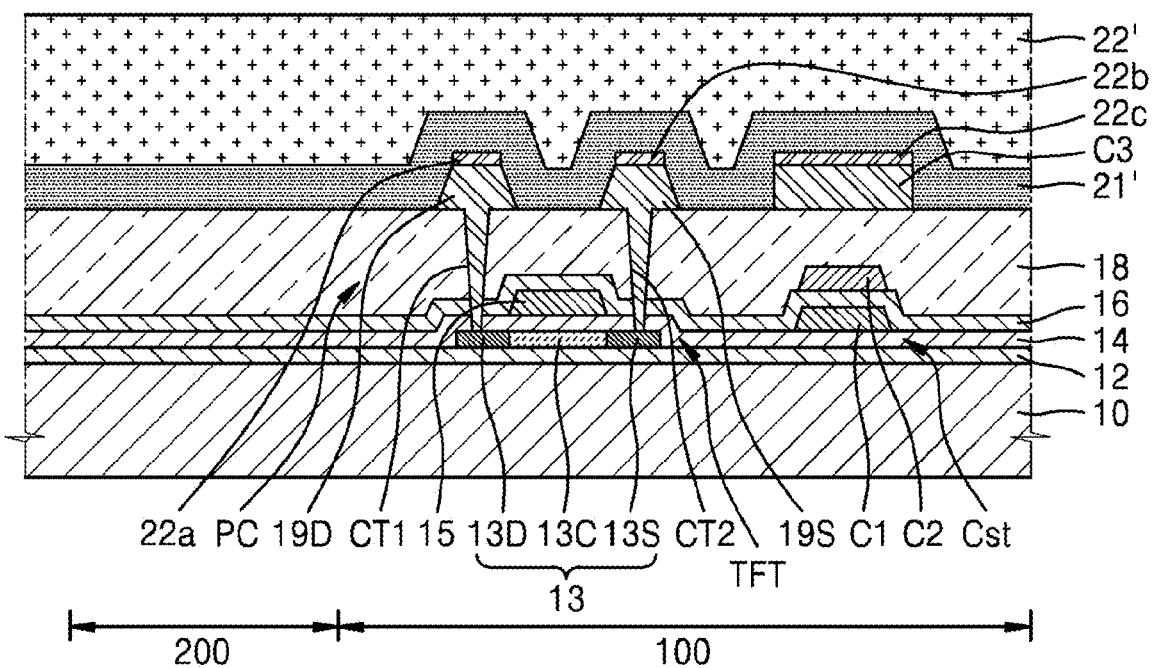

Referring to FIG. 6F, a material 21' for forming the black matrix 21 (see FIG. 6H) and a material 22' for forming the via-insulating film 22 (see FIG. 6H) may be coated in the first region 100 and the second region 200 on the pixel circuit unit PC.

The material 21' for forming the black matrix 21 may include an organic insulating material containing a black pigment, and may absorb about 90% or more of incident light, and the material 22' for forming the via-insulating film 22 may be an organic material such as polyimide.

Figure 6G:
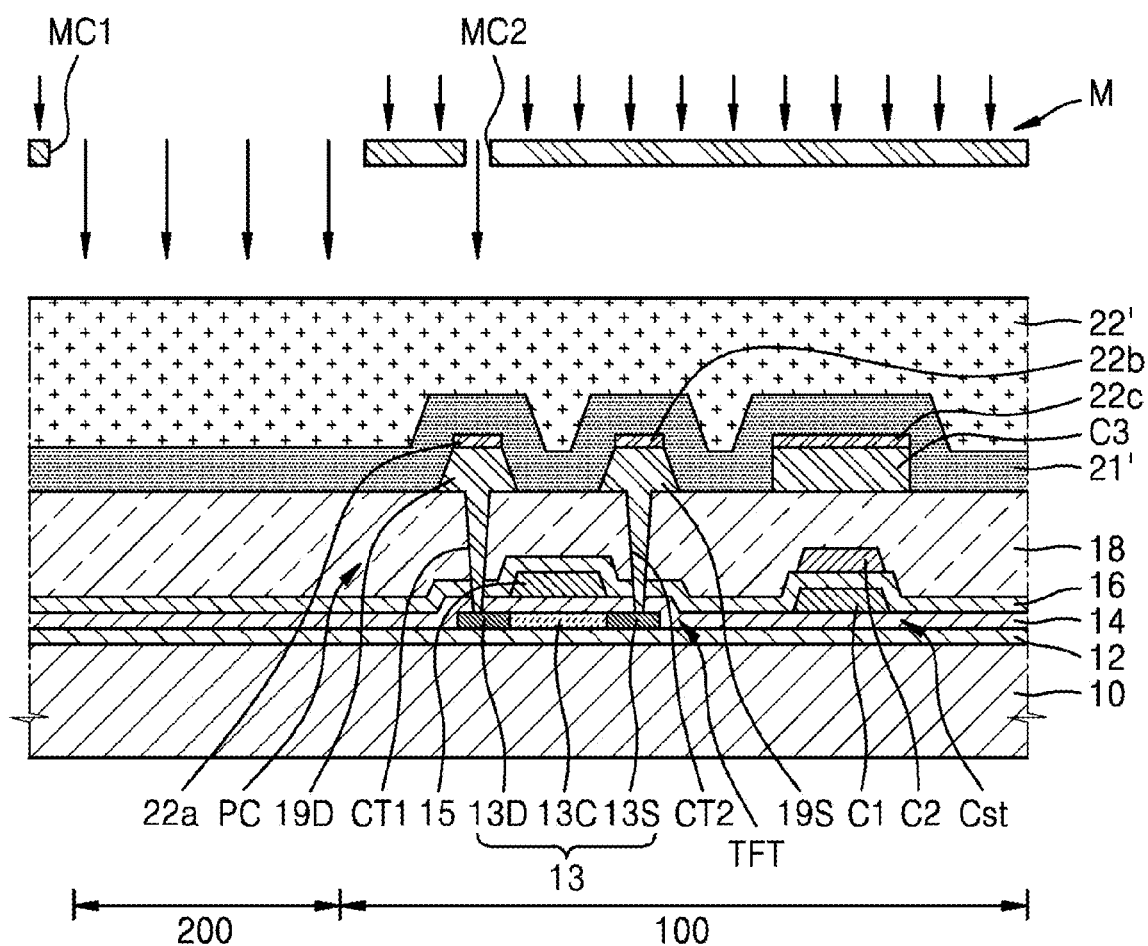

Referring to FIG. 6G, light may be emitted to the material 22' for forming the via-insulating film 22 by using a mask M including a first light-transmitting portion MC1 that corresponds to the second region 200 and a second light-transmitting portion MC2 that corresponds to a portion of the drain electrode 19D.

The light that is irradiated to the material 22' for forming the via-insulating film 22 has to be appropriately adjusted not to reach the material 21' for forming the black matrix 21. The material 22' for forming the via-insulating film 22 may function as a positive photoresist, and the material 21' for forming the black matrix 21 may function as a negative photoresist. That is, since a portion of the material 22' for forming the via-insulating film 22 to which the light is irradiated may be removed during development and a portion of the material 21' for forming the black matrix 21 to which the light is not irradiated may be removed during the development, the light may be emitted only to the material 22' for forming the via-insulating film 22.

Figure 6H:
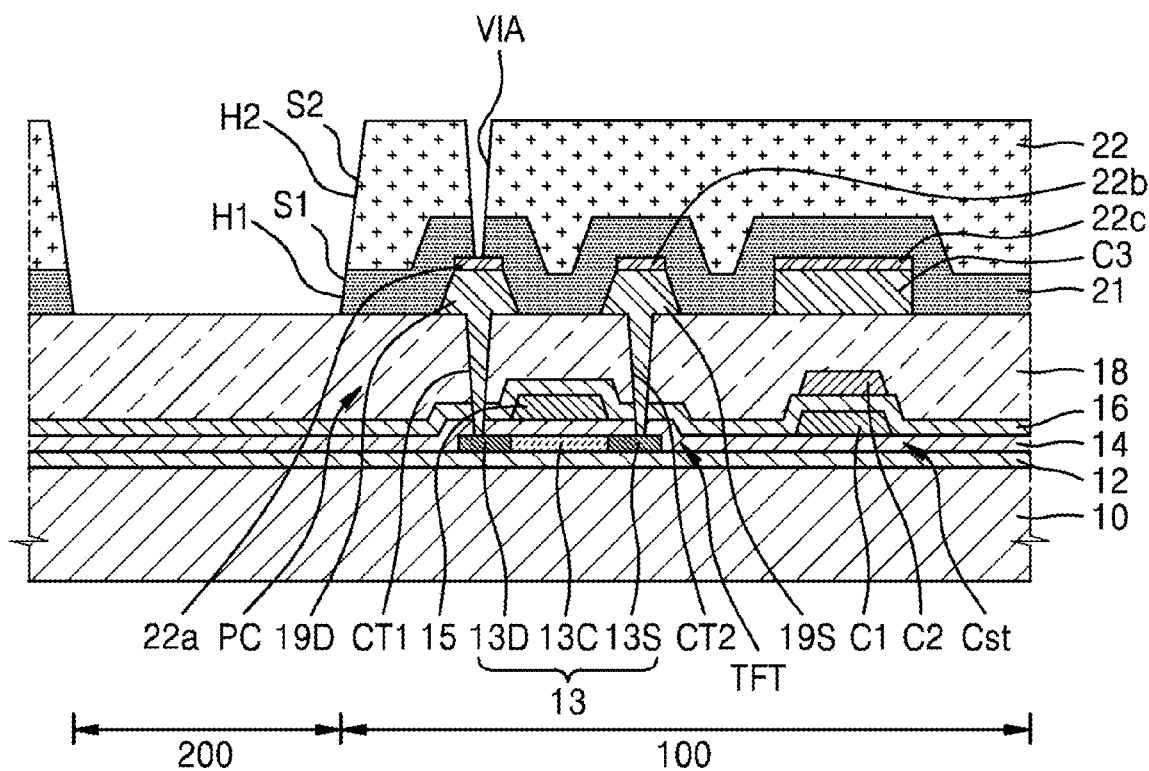

Referring to FIG. 6H, since the portion of the material 22' for forming the via-insulating film 22 to which the light is irradiated and the portion of the material 21' for forming the black matrix 21 that is disposed under the portion of the material 22' for forming the via-insulating film 22 to which the light is irradiated are removed through development, the first opening H1 and the second opening H2 may be formed.

Accordingly, the first opening H1 and the second opening H2 may be simultaneously formed by using one mask process. Since the first opening H1 and the second opening H2 are simultaneously formed, the first etched surface S1 of the first opening H1 and the second etched surface S2 of the second opening H2 may be connected to each other without a stepped portion.

Likewise, since portions of the material 22' for forming the via-insulating film 22 and the material 21' for forming the black matrix 21 that correspond to the drain region 19D are also simultaneously removed, the via-hole VIA may be formed.

Figure 6I:
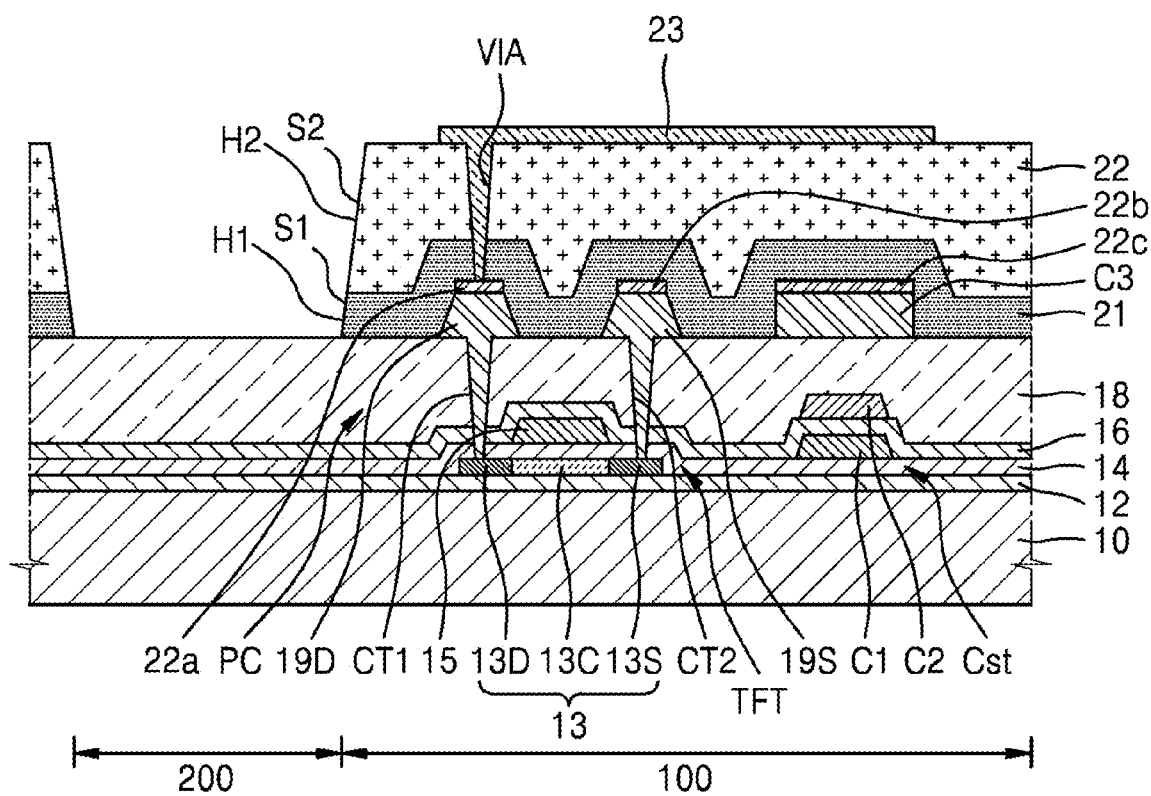
Figure 6J:
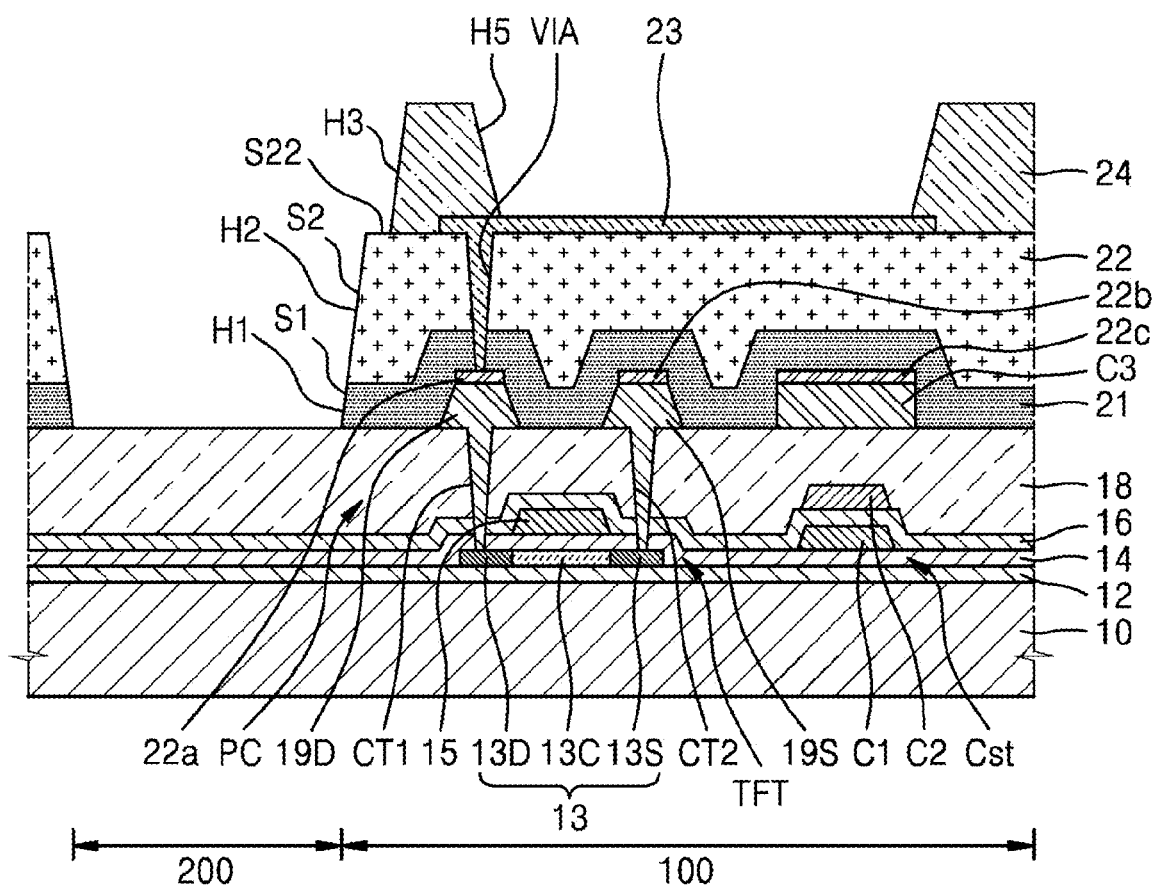
Figure 6K:
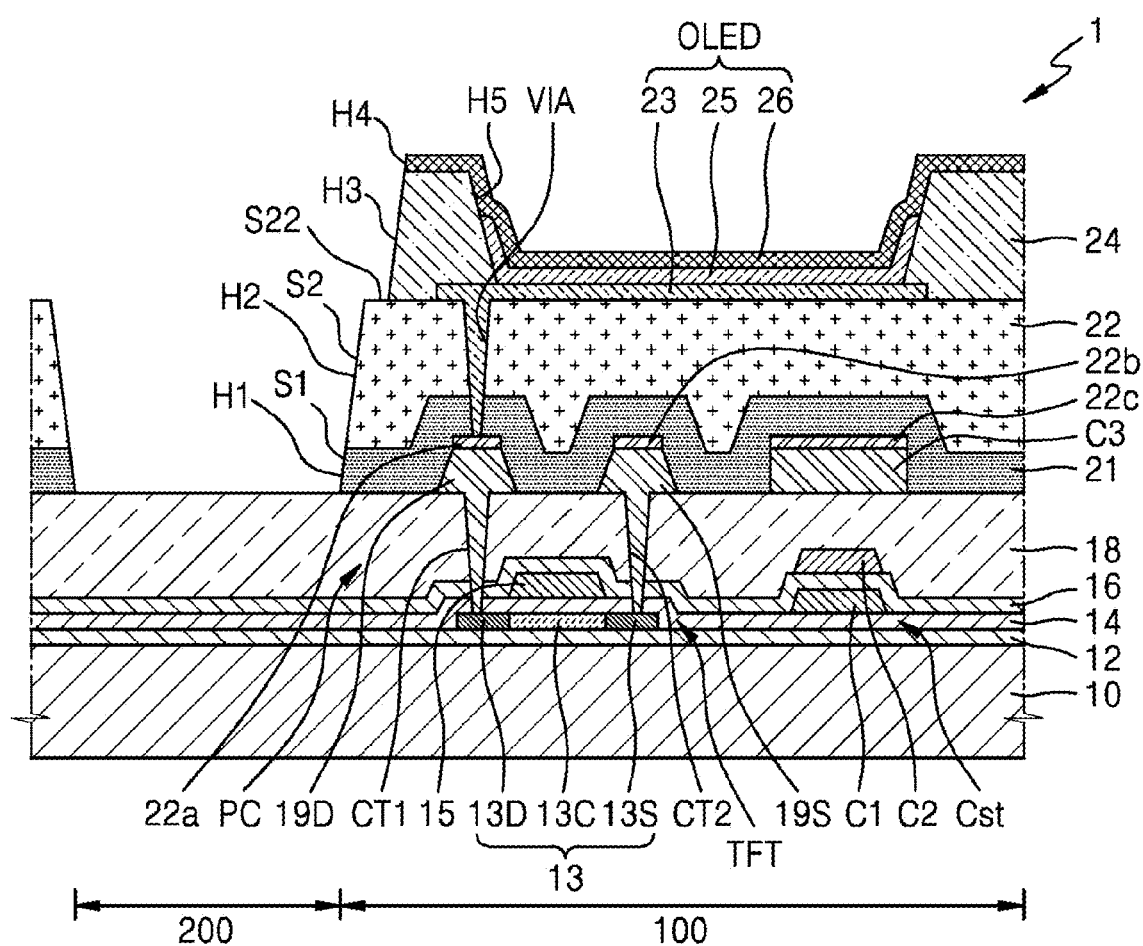

Referring to FIGS. 6I through 6K, the OLED may be formed in the first region 100 on the via-insulating film 22.

Referring to FIG. 6I, the pixel electrode 23 that is electrically connected to the drain electrode 19D of the TFT through the via-hole VIA may be formed in the first region 100 on the via-insulating film 22.

The pixel electrode 23 may be a reflective electrode, and may include a reflective layer including Ag, Mg, Al, Pd, Pd, Au, Ni, Nd, Ir, Cr, and/or a compound thereof and a transparent or semi-transparent electrode layer that is formed over and/or under the reflective layer. The pixel electrode 23 may be formed as an isolated island in each sub-pixel, and may be formed in the first region 100 of each sub-pixel.

Referring to FIG. 6J, after a material for forming the pixel-defining film 24 on the pixel electrode 23 is coated on an entire surface of the substrate 10, the third opening H3 that corresponds to the second region 200 and the fifth opening H5 through which a part of the pixel electrode 23 is exposed may be formed by patterning the material.

The third opening H3 may have an area that is greater than areas of the first opening H1 and the second opening H2, and the part S22 of a top surface of the via-insulating film 22 may be exposed through the second opening H2 and the third opening H3.

However, according to another exemplary embodiment, the third opening H3 may have an area that is less than areas of the first opening H1 and the second opening H2, and may be formed to include a portion that extends along inner surfaces of the first opening H1 and the second opening H2.

Referring to FIG. 6K, after the intermediate 25 including an organic emission layer is formed on the pixel electrode 23 that is exposed through the fifth opening H5, the counter electrode 26 may be formed on the intermediate layer 25.

The intermediate layer 25 may include the organic emission layer that emits light, and may further include at least one of an HIL, an HTL, an ETL, and an EIL. However, the present exemplary embodiment is not limited thereto, and various functional layers may be further disposed between the pixel electrode 23 and the counter electrode 26.

The counter electrode 26 may be a transparent or semi-transparent electrode, and may include at least one material selected from Ag, Al, Mg, Li, Ca, Cu, LiF/Ca, LiF/Al, MgAg, and CaAg. The counter electrode 26 may be formed as a thin film having a thickness ranging from several to tens of nm to transmit therethrough light emitted from the intermediate layer 25 to the outside. The counter electrode 26 may be provided to be electrically connected to all pixels that are included in the organic light-emitting display apparatus 1.

The counter electrode 26 may include the fourth opening H4 that is formed through a patterning process after a material for forming the counter electrode 26 is coated. However, according to another exemplary embodiment, the counter electrode 26 may not include the fourth opening H4, and may extend along inner surfaces of the first through third openings H1, H2, and H3 to cover a top surface of the interlayer insulating film 18 that is exposed through the first through third openings H1, H2, and H3.

According to an exemplary embodiment, there may be provided a see-through organic light-emitting display apparatus such as any of the first through third organic light-emitting display apparatuses 1, 2, and 3, which may increase an aperture ratio of the second region 200, may increase a transmittance, and may reduce the number of masks, and a method of manufacturing the see-through organic light-emitting display apparatus.

According to the one or more exemplary embodiments, a see-through organic light-emitting display apparatus that has an increased transmittance and a method of manufacturing an organic light-emitting display apparatus that reduces costs by reducing the number of masks used during a process of manufacturing the see-through organic light-emitting display apparatus may be provided. The scope of the inventive concept is not limited to the effect.

While the inventive concept has been particularly shown and described with reference to exemplary embodiments thereof, they are provided for the purposes of illustration and it will be understood by those of ordinary skill in the art that various modifications and equivalent other embodiments can be made from the inventive concept. Accordingly, the true technical scope of the inventive concept is defined by the technical spirit of the appended claims.

What is claimed is:

1. An organic light-emitting display apparatus comprising:
    a substrate;
    a plurality of pixels disposed on the substrate, each of the plurality of pixels comprising a first region through which light is emitted and a second region through which external light is transmitted;
    a pixel circuit unit disposed in the first region of each of the plurality of pixels and comprising at least one thin-film transistor (TFT);
    a black matrix covering the pixel circuit unit and comprising a first opening corresponding to the second region;
    a via-insulating film disposed on the black matrix and comprising a second opening corresponding to the second region; and
    a light-emitting device disposed in the first region on the via-insulating film.

2. The organic light-emitting display apparatus of claim 1, a first etched surface of the first opening and a second etched surface of the second opening being connected to each other without a stepped portion.

3. The organic light-emitting display apparatus of claim 1, each of the at least one TFT comprising:
    an active layer disposed on the substrate;
    a gate electrode disposed on the active layer and insulated from the active layer;
    a first gate insulating film disposed between the active layer and the gate electrode;

an interlayer insulating film disposed on the gate electrode; and a source electrode and a drain electrode disposed on the interlayer insulating film and electrically connected to the active layer, respectively, the black matrix and the via-insulating film covering the source electrode and the drain electrode.

4. The organic light-emitting display apparatus of claim 3, the first gate insulating film and the interlayer insulating film being disposed in the first region and the second region, and are single films having a substantially same refractive index.

5. The organic light-emitting display apparatus of claim 4, a top surface of the interlayer insulating film being exposed through the first opening formed in the black matrix and the second opening formed in the via-insulating film.

6. The organic light-emitting display apparatus of claim 3, further comprising a second gate insulating film disposed between the first gate insulating film and the interlayer insulating film, the second gate insulating film is a single film having a substantially same refractive index as the first gate insulating film and the interlayer insulating film.

7. The organic light-emitting display apparatus of claim 6, further comprising a capacitor comprising a first electrode disposed on the first gate insulating film,
a second electrode disposed on the second gate insulating film, and
a third electrode disposed on the interlayer insulating film.

8. The organic light-emitting display apparatus of claim 1, the light-emitting device comprising:

a pixel electrode disposed in the first region of each of the plurality of pixels and electrically connected to the pixel circuit unit;

a pixel-defining film covering at least a part of the pixel electrode;

a counter electrode facing the pixel electrode, electrically connected to the plurality of pixels, and disposed in at least the first region of each of the plurality of pixels; and an intermediate layer disposed between the pixel electrode and the counter electrode and comprising an organic emission layer, the pixel-defining film comprising a third opening that corresponds to the second region.

9. The organic light-emitting display apparatus of claim 8, the counter electrode comprising a fourth opening that corresponds to the second region.

10. The organic light-emitting display apparatus of claim 8, the third opening having an area greater than an area of the first opening and an area of the second opening, and a part of a top surface of the via-insulating film being exposed between the first opening and the third opening.

11. The organic light-emitting display apparatus of claim 8, the third opening having an area less than an area of the first opening and an area of the second opening, and comprising a portion extending along inner surfaces of the first opening and the second opening.

12. A method of manufacturing an organic light-emitting display apparatus, the method comprising:

forming a pixel circuit unit comprising at least one thin-film transistor (TFT) on a substrate comprising a first region through which light is emitted and a second region through which external light is transmitted;

forming a black matrix on the pixel circuit unit;
forming a via-insulating film on the black matrix;
respectively forming a first opening and a second opening that correspond to the second region in the black matrix and the via-insulating film by simultaneously patterning the black matrix and the via-insulating film; and forming a light-emitting device in the first region on the via-insulating film.

13. The method of claim 12, the forming of the first opening and the second opening comprising:

irradiating light to a portion of the via-insulating film that corresponds to the second region; and forming the first opening and the second opening by removing the portion of the via-insulating film to which the light is irradiated and a portion of the black matrix that is disposed under the portion of the via-insulating film to which the light is irradiated.

14. The method of claim 12, the forming of the pixel circuit unit comprising:

forming an active layer in the first region on the substrate;
forming a first gate insulating film to cover the active layer;
forming a gate electrode on the first gate insulating film;
forming an interlayer insulating film to cover the gate electrode; and
forming a source electrode and a drain electrode on the interlayer insulating film, the first gate insulating film and the interlayer insulating film extending from the first region to the second region.

15. The method of claim 14, the first gate insulating film and the interlayer insulating film being formed as single films having a substantially same refractive index.

16. The method of claim 15, after the forming of the gate electrode, the method further comprising forming a second gate insulating film to cover the gate electrode, the second gate insulating film being formed as a single film having a substantially same refractive index as the first gate insulating film and the interlayer insulating film.

17. The method of claim 12, the forming of the light-emitting device comprising:

forming, in the first region on the via-insulating film, a pixel electrode that is electrically connected to the pixel circuit unit;

forming a pixel-defining film on the pixel electrode;

forming a third opening that corresponds to the second region and a fifth opening through which a part of the pixel electrode is exposed by patterning the pixel-defining film;

forming an intermediate layer comprising an organic emission layer on the pixel electrode that is exposed through the fifth opening; and forming a counter electrode on the intermediate layer.

18. The method of claim 17, after the forming of the counter electrode, the method further comprising forming a fourth opening that corresponds to the second region by patterning the counter electrode.

19. The method of claim 17, the third opening has an area greater than an area of the first opening and an area of the second opening, and is formed so that a part of a top surface of the via-insulating film is exposed between the second opening and the third opening.

20. The method of claim 17, the third opening has an area less than an area of the first opening and less than an area of the second opening, and is formed to comprise a portion that extends along inner surfaces of the first opening and the second opening.

21. An organic light-emitting display apparatus comprising:

a substrate;

a plurality of pixels disposed on the substrate, each of the plurality of pixels comprising a first region through which light is emitted and a second region through which external light is transmitted;

a pixel circuit unit disposed in the first region of each of the plurality of pixels and comprising at least one thin-film transistor (TFT);

a black matrix covering and contacting the pixel circuit unit and comprising a first opening corresponding to the second region;

a via-insulating film disposed on the black matrix and comprising a second opening corresponding to the second region; and a light-emitting device disposed in the first region on the via-insulating film.

* * * * *